United States Patent
Uchida et al.

(10) Patent No.: US 9,674,898 B2
(45) Date of Patent: *Jun. 6, 2017

(54) INDUCTION HEATING APPARATUS AND INDUCTION HEATING METHOD

(71) Applicant: Mitsui Engineering & Shipbuilding Co., Ltd., Tamano-shi, Okayama (JP)

(72) Inventors: Naoki Uchida, Tamano (JP); Yoshihiro Okazaki, Tamano (JP); Kazuhiro Ozaki, Tamano (JP)

(73) Assignee: Mitsui Engineering and Shipbuilding Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/564,690

(22) Filed: Dec. 9, 2014

(65) Prior Publication Data

US 2015/0090707 A1    Apr. 2, 2015

Related U.S. Application Data

(62) Division of application No. 13/816,198, filed as application No. PCT/JP2011/067346 on Jul. 28, 2011.

(30) Foreign Application Priority Data

Aug. 9, 2010   (JP) .................................. 2010-178725

(51) Int. Cl.
   *H05B 6/10*   (2006.01)
   *H05B 6/02*   (2006.01)
   (Continued)

(52) U.S. Cl.
   CPC ......... *H05B 6/06* (2013.01); *H01L 21/67109* (2013.01); *H05B 6/105* (2013.01); *H05B 6/44* (2013.01)

(58) Field of Classification Search
   CPC ... H05B 6/06; H05B 6/36; H05B 6/44; H05B 6/105
   (Continued)

(56) References Cited

U.S. PATENT DOCUMENTS 4,082,865 A    4/1978 Ban et al.
4,652,713 A *  3/1987 Omori et al. .................. 219/661
(Continued)

FOREIGN PATENT DOCUMENTS

CN        1129349 C       11/2003
JP      H08-187972 A       7/1996
(Continued)

OTHER PUBLICATIONS

Office Action from People's Republic of China Intellectual Property Office in the corresponding Chinese application 2-1180038790.7 dated Sep. 29, 2014, 6 pp. in Chinese, with 3 pp. of partial English translation.
(Continued)

*Primary Examiner* — Tu B Hoang
*Assistant Examiner* — Alba Rosario-Aponte
(74) *Attorney, Agent, or Firm* — Juan Carlos A. Marquez; Marquez IP Law Office, PLLC

(57) ABSTRACT

A semiconductor substrate thermal treatment apparatus enables excellent heating control in suppressing influence of mutual induction between induction heating coils even when the induction heating coils are arranged in the vertical direction while providing horizontal magnetic flux to susceptors. The apparatus indirectly heats wafers mounted on horizontally-arranged susceptors including induction heating coils to form alternate-current magnetic flux in a direction parallel to a mount face of the susceptor. The wafer are arranged at an outer circumferential side of the susceptor. The induction heating coils are structured with at least one
(Continued)

main heating coil and subordinate heating coils electromagnetically coupled with the main heating coil. Inverse coupling coils inversely-coupled to the subordinate heating coils are provided to the main heating coil, and zone control means separately controls a power ratio while synchronizing frequencies and current waveforms of current to the main heating coil and adjacent subordinate heating coils.

3 Claims, 5 Drawing Sheets

(51) Int. Cl.
    *H05B 6/06* (2006.01)
    *H01L 21/67* (2006.01)
    *H05B 6/44* (2006.01)
(58) Field of Classification Search
    USPC .............. 219/600, 634, 661, 662, 673, 631
    See application file for complete search history.

(56) References Cited

U.S. PATENT DOCUMENTS

| | | | |
|---|---|---|---|
| 6,188,054 B1 * | 2/2001 | Ohta | 219/663 |
| 6,224,934 B1 | 5/2001 | Hasei et al. | |
| 6,373,036 B2 * | 4/2002 | Suzuki | 219/619 |
| 6,542,535 B2 | 4/2003 | Fishman et al. | |
| 7,315,011 B2 | 1/2008 | Alfredeen | |
| 8,658,951 B2 | 2/2014 | Yonenaga et al. | |
| 2006/0118549 A1 * | 6/2006 | Fishman | H05B 6/067 219/656 |
| 2006/0127601 A1 | 6/2006 | Murakami et al. | |
| 2008/0063025 A1 | 3/2008 | Fishman et al. | |
| 2008/0240805 A1 | 10/2008 | Kinouchi et al. | |
| 2009/0114640 A1 | 5/2009 | Nadot et al. | |
| 2010/0258557 A1 * | 10/2010 | Kinouchi et al. | 219/671 |
| 2011/0210117 A1 | 9/2011 | Yonenaga et al. | |
| 2011/0248024 A1 * | 10/2011 | Yonenaga | H01L 21/67303 219/634 |

FOREIGN PATENT DOCUMENTS

| | | | |
|---|---|---|---|
| JP | 2002-313547 | | 10/2002 |
| JP | 2002-313547 A | | 10/2002 |
| JP | 2003-100643 | | 4/2003 |
| JP | 2003-100643 A | | 4/2003 |
| JP | 2004-071596 | | 3/2004 |
| JP | 2004-221138 A | | 8/2004 |
| JP | 2006-100067 | | 4/2006 |
| JP | 2006-278097 A | | 10/2006 |
| JP | 2008-034780 | | 2/2008 |
| JP | 2008-257246 | | 10/2008 |
| JP | 2009-087702 | | 4/2009 |
| JP | 2009-087703 A | | 4/2009 |
| JP | 2010-059490 A | | 3/2010 |
| JP | 2010059490 A * | | 3/2010 |
| JP | 4676567 B1 * | 4/2011 | ....... H01L 21/67109 |
| WO | WO 2010047155 A | | 6/2009 |
| WO | WO 2010/026815 A1 | | 3/2010 |
| WO | WO 2010026815 A1 | | 3/2010 |

OTHER PUBLICATIONS

International Search Report issued from the International Bureau in the corresponding International Application No. PCT/JP2001/067346, mailed Aug. 23, 2011.

Office Action from German Patent and Trade Mark Office in the corresponding German application 11 2011 102 681.1 dated Jun. 25, 2014, 3 pp. in English.

* cited by examiner

INDUCTION HEATING APPARATUS AND INDUCTION HEATING METHOD

CROSS-REFERENCE TO RELATED APPLICATION

This application is a Divisional of U.S. application Ser. No. 13/816,198 filed Feb. 8, 2013. Priority is claimed based on U.S. application Ser. No. 13/816,198 filed Feb. 8, 2013, which claims priority from PCT application PCT/JP2011/067341 filed on Jul. 28, 2011, and Japanese application JP2010-178725 filed on Aug. 9, 2010, the content of which is hereby incorporated by reference into this application.

TECHNICAL FIELD

The present invention relates to an apparatus and a method of induction heating, and in particular, relates to an apparatus and a method for semiconductor substrate thermal treatment preferable for performing temperature control of an object to be heated when a substrate such as a wafer with a large diameter is treated.

BACKGROUND ART

Patent Literature 1 and Patent Literature 2 disclose apparatuses to perform thermal treatment of a substrate such as a semiconductor wafer utilizing induction heating. As illustrated in FIG. 5, in the thermal treatment apparatus disclosed in Patent Literature 1 being a batch type thermal treatment apparatus, wafers 2 stacked in multiple stages are put into a crystal process tube 3, a heating tower 4 which is formed with an electrically-conductive member such as graphite is placed at the outer circumference of the process tube 3, and a solenoid-like induction heating coil 5 is arranged at the outer circumference thereof. According to the thermal treatment apparatus 1 having the abovementioned structure, the heating tower 4 is heated owing to an influence of magnetic flux generated by the induction heating coil 5 and the wafers 2 placed in the process tube 3 is heated by radiation heat from the heating tower 4.

Further, as illustrated in FIG. 6, in the thermal treatment apparatus disclosed in Patent Literature 2 being a sheet type thermal treatment apparatus, concentrically hyper-fractionated susceptors 7 are formed of graphite or the like, wafers 8 are placed at the upper face side of the susceptors 7, and a plurality of circular induction heating coils 9 are placed at the lower face side on a concentric circle. Here, power control can be performed separately against the plurality of induction heating coils 9. According to the thermal treatment apparatus 6 having the abovementioned structure, since heat transfer between a susceptor 7 located in a heating range of each induction heating coil 9 and another susceptor 7 heated by another induction heating coil 9 is suppressed, controllability of temperature distribution of the wafers 8 due to power control against the induction heating coils 9 is improved.

Further, Patent Literature 2 discloses that heat distribution is appropriately controlled by fractionating the susceptors 7 on which the wafers 8 are placed. Patent Literature 3 discloses that heat distribution is improved with devising of a sectional shape of a susceptor. According to a thermal treatment apparatus disclosed in Patent Literature 3, through consideration that a heat generation amount becomes small at the inner side having small diameter of a circularly-formed induction heating coil, increase of the heat generation amount and increase of thermal capacity are to be achieved as causing a distance to an inner side part from the induction heating coil to be shorter than that to an outer side part by enlarging thickness at the inner side part of the susceptor.

CITATION LIST

Patent Literatures

Patent Literature 1: JP 2004-71596 A
Patent Literature 2: JP 2009-87703 A
Patent Literature 3: JP 2006-100067 A

SUMMARY OF INVENTION

Technical Problem

In any of the thermal treatment apparatuses structured as described above, magnetic flux is to be exerted in perpendicular to graphite. Accordingly, when a metal film or the like is formed at a surface of the wafer as an object to be heated, there may be a case that a wafer is directly heated and a case that temperature distribution control is disturbed.

In contrast, when heating is accelerated by providing magnetic flux in the horizontal direction against graphite (susceptor), it becomes difficult to heat a number of susceptors in lamination arrangement. In a case that a plurality of induction heating coils are closely arranged in the laminating direction (vertical direction) to solve the above, there arises a problem that heating control becomes unstable under an influence of mutual induction between induction heating coils.

An object of the present invention is to provide an apparatus and a method of induction heating which solve the abovementioned problems and which are capable of enabling excellent heating control as suppressing an influence of mutual induction between induction heating coils even when a plurality of the induction heating coils are arranged in the vertical direction while providing horizontal magnetic flux to susceptors.

Solution to Problem

An induction heating apparatus according to the present invention for achieving the above object includes a plurality of induction heating coils which are arranged at an outer circumferential side of a plurality of susceptors horizontally arranged as being laminated in the vertical direction and which are adjacently stacked along an arrangement direction of the susceptors while mount faces of the susceptors for objects to be heated and a center axis of winding are in parallel, an inverter which supplies current so that the adjacently arranged induction heating coils have mutually subtractive polarities, and zone control means which separately controls a power ratio supplied to the plurality of the induction heating coils which are adjacently arranged.

Further, in the induction heating apparatus having the abovementioned features, it is preferable that the induction heating coils are structured with at least one main heating coil and a subordinate heating coil which is electromagnetically coupled with the main heating coil and that an inverse coupling coil is connected to the main heating coil to generate mutual inductance having a reverse polarity to mutual inductance generated at a space against the subordinate heating coil.

With the abovementioned structure, it is possible to cancel or partially cancel mutually induced electromotive force generated between the main heating coil and the subordinate heating coil owing to action of the inverse coupling coil.

Further, in the induction heating apparatus having the abovementioned features, it is preferable that a core on which the main heating coil and the subordinate heating coil are wound is provided and that the inverse coupling coil is arranged to have relation of an additive polarity against the subordinate heating coil wound on the core.

With the abovementioned structure, owing to that frequencies of current supplied to the main heating coil and the subordinate heating coil are matched and current waveforms are synchronized, the inverse coupling coil generates mutual inductance having a reverse polarity to mutual inductance generated between the subordinate heating coil and the main heating coil. Accordingly, it is possible to cancel or partially cancel mutually induced electromotive force generated between the main heating coil and the subordinate heating coil.

Further, an induction heating method for achieving the above object to perform induction heating on an object to be heated which is arranged on each of a plurality of susceptors horizontally arranged as being laminated in the vertical direction includes supplying current so that adjacent induction heating coils have mutually subtractive polarities after a plurality of induction heating coils which generate horizontal magnetic flux against mount faces of the susceptors for objects to be heated are adjacently stacked along a laminating direction of the susceptors, and separately controlling a power ratio to be supplied to the induction heating coils.

Further, it is preferable that the induction heating method having the abovementioned features includes generating mutual inductance having a reverse polarity to mutual inductance generated between the adjacent induction heating coils, and cancelling or partially cancelling the mutual inductance generated between the induction heating coils.

With the abovementioned method, it is possible to cancel or partially cancel mutually induced electromotive force generated between the main heating coil and the subordinate heating coil.

Further, in the induction heating method having the abovementioned features, it is preferable that the mutual inductance having the reverse polarity is generated by an inverse coupling coil which is formed by being wound on a core being same as the core on which the induction heating coil is wound.

With the abovementioned method, the inverse coupling coil can be compactly arranged.

Advantageous Effects of Invention

According to the apparatus and the method of induction heating having the abovementioned features, influences of mutual induction between induction heating coils can be suppressed and excellent heating control can be performed even in a case that a plurality of the induction heating coils are arranged in the vertical direction while providing horizontal magnetic flux to susceptors.

BRIEF DESCRIPTION OF DRAWINGS

FIG. 1-2 is a block diagram illustrating a side structure of the thermal treatment apparatus according to the first embodiment.

FIG. 2 is a block diagram illustrating a structure of a power source portion in the thermal treatment apparatus according to the first embodiment.

FIG. 4-1 is a block diagram illustrating a plane structure of a thermal treatment apparatus according to a second embodiment.

FIG. 4-2 is a block diagram illustrating a plane structure of a core used for the thermal treatment apparatus according to the second embodiment.

DESCRIPTION OF EMBODIMENTS

Figure 1:
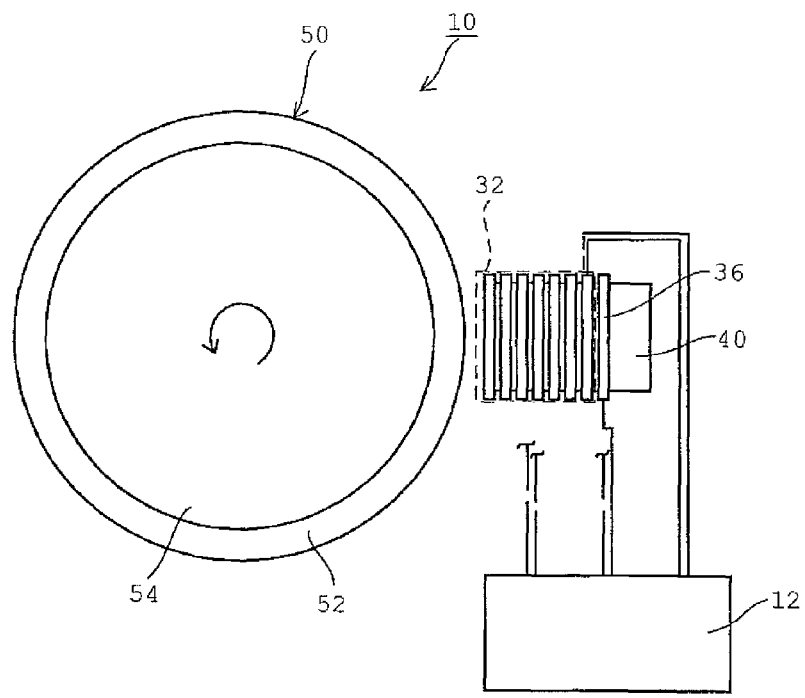
FIG. 1-1 is a block diagram illustrating a plane structure of a thermal treatment apparatus according to a first embodiment.
Figures 1, 2:
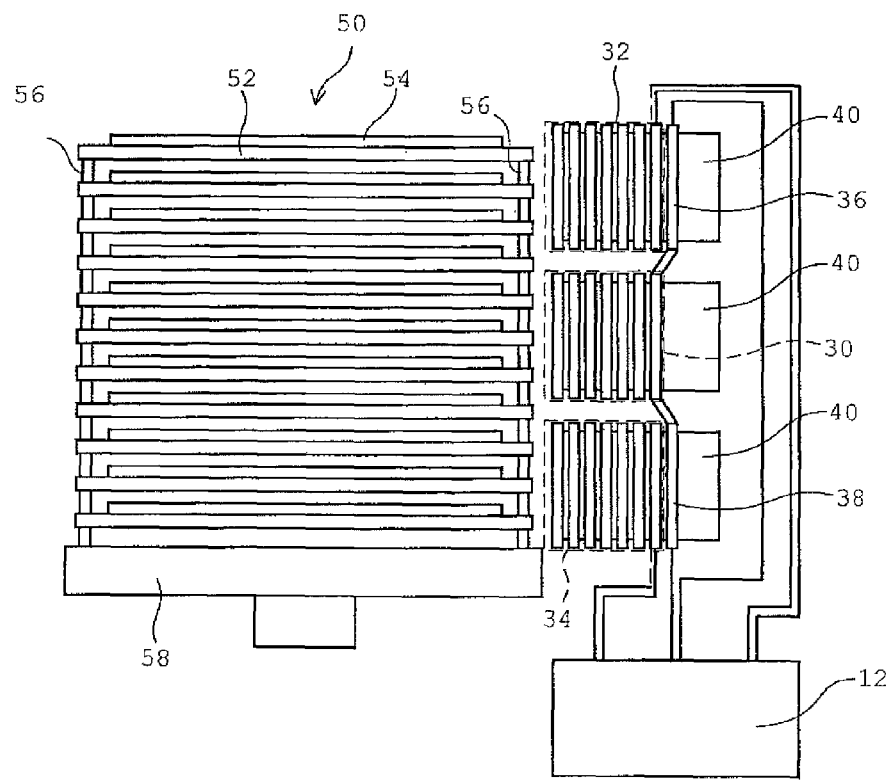
Figure 2:
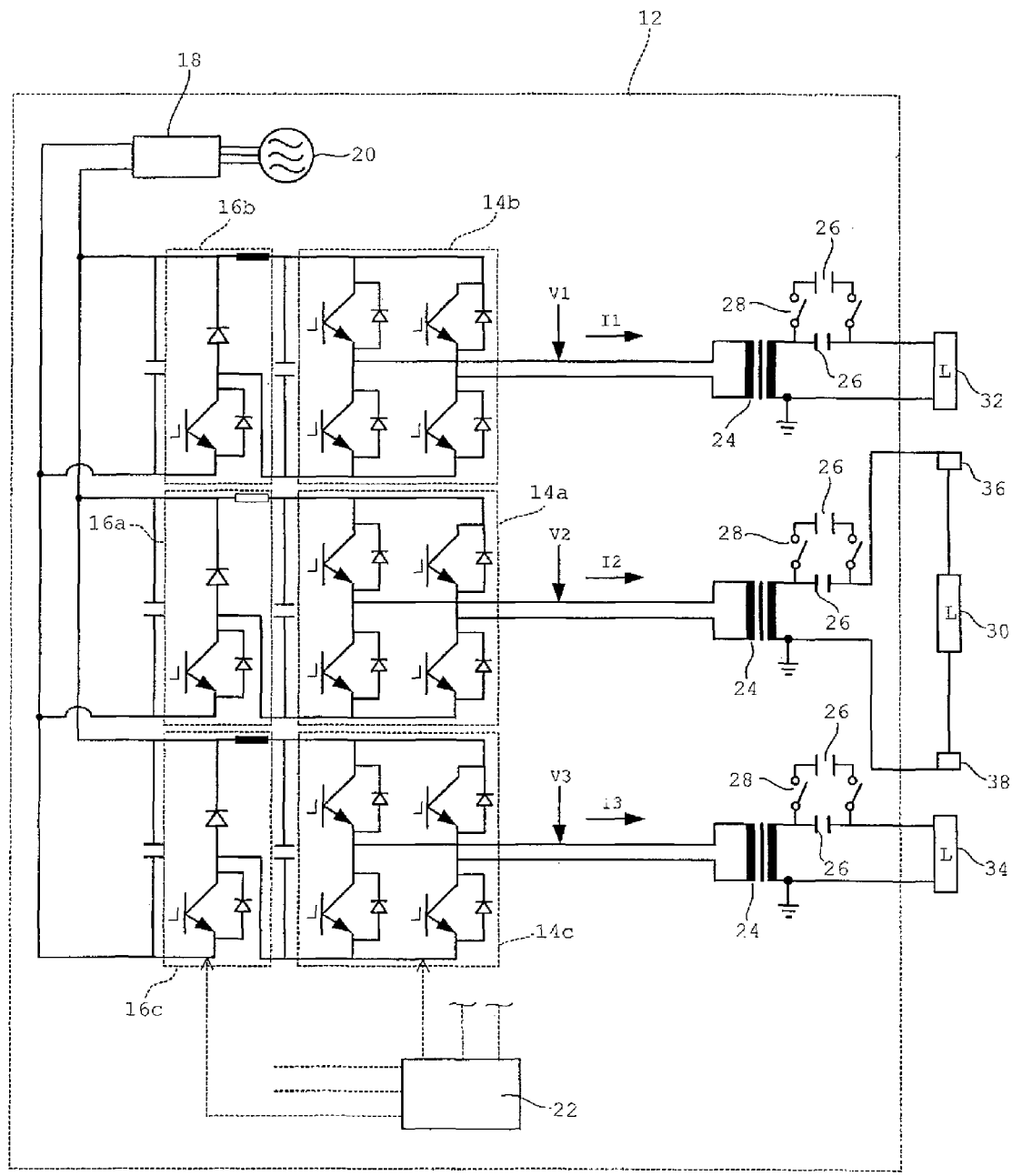

In the following, embodiments of an induction heating apparatus and an induction heating method according to the present invention will be described in detail with reference to the drawings. First, a general structure of an induction heating apparatus (hereinafter, simply called a thermal treatment apparatus) according to a first embodiment will be described with reference to FIGS. 1-1, 1-2 and 2. Here, FIG. 1-1 is a block diagram illustrating a plane structure of the thermal treatment apparatus and FIG. 1-2 is a block diagram illustrating a side structure of the thermal treatment apparatus. Further, FIG. 2 is an explanatory view of a structure of a power source portion.

The thermal treatment apparatus 10 according to the present embodiment is a batch type to perform a thermal treatment while wafers 54 as objects to be heated and susceptors 52 as heating elements are stacked in multiple stages. The thermal treatment apparatus 10 is structured basically with a boat 50 with the wafers 54 and horizontally-arranged susceptors 52 which are laminated in multiple stages in the vertical direction, induction heating coils (a main heating coil 30, subordinate heating coils 32, 34, and inverse coupling coils 36, 38 which are described later in detail) which heat the susceptors 52, and a power source portion 12 which supplies electric power to the induction heating coils.

The susceptors 52 are simply required to be structured with electrically-conductive members as being formed of graphite, SiC, SiC-coated graphite, heat-resistant metal or the like, for example. In the present embodiment, each susceptor 52 has a circular plane shape.

The susceptors 52 structuring the boat 50 are arranged as being laminated respectively via a support member 56. Here, the support members 56 are formed of quartz which is not affected by electromagnetic induction heating.

Further, the boat 50 of the present embodiment is mounted on a rotary table 58 which has a motor (not illustrated) and is capable of rotating the susceptors 52 and wafers 54 under thermal treatment procedure. With such a structure, it is possible to suppress deflection of heat distribution to heat the susceptors 52. Further, as described later, the susceptors 52 can be evenly heated even with an arrangement formation that the induction heating coil being the heating source is deflected from the center of the susceptors 52.

The induction heating coils according to the present embodiment are structured with the single main heating coil 30 and the two subordinate heating coils 32, 34 which are arranged adjacently to the main heating coil 30 to be electromagnetically coupled. Each of the above is arranged at the circumference of the susceptors 52 at the outer circumferential side. The main heating coil 30 and the subordinate heating coils 32, 34 are adjacently stacked respectively in the same direction as the lamination direction of the susceptors 52. Further, the main heating coil 30 according to the present embodiment is provided with the inverse coupling coils 36, 38 which are electromagnetically inversely-coupled with the two subordinate heating coils 32, 34. Here, the electromagnetic coupling denotes a state of being in relation of mutual induction to cause the subordinate heating coils 32, 34 to generate induced electromotive force in a direction to cancel magnetic flux generated by the main heating coil 30 based on variation of current supplied to the main heating current 30, for example, that is, a state of generating mutual inductance. Further, the electromagnetic inverse coupling denotes a coupling state of generating mutual inductance having a reverse polarity to the mutual inductance generated between the main heating coil 30 and the subordinate heating coil 32, 34 in a case of viewing the main heating coil 30 as primary winding (primary coil) and the subordinate heating coil 32, 34 respectively as secondary winding (secondary coil).

Each of the induction heating coils (the main heating coil 30 and the subordinate heating coils 32, 34) are structured by winding a copper wire on a core 40 which is arranged at the outer circumferential side of the boat 50. The core 40 may be formed of ferrite-based ceramic with firing after clay-like material is formed into a shape. This is because the core 40 formed of the abovementioned material enables to flexibly perform shape forming. Further, compared to a case with a separate induction heating coil, owing to using the core 40, diffusion of magnetic flux can be prevented and highly-efficient induction heating with concentrated magnetic flux can be actualized.

In the present embodiment, winding directions of the main heating coil 30 and the subordinate heating coils 32, 34 respectively against the core 40 are the same. Further, the inverse coupling coil 36, 38 is arranged at a rear end side of the core 40 to which the subordinate heating coil 32, 34 is arranged at a top end side (side where the susceptor 52 is arranged) in a state that the winding direction thereof is reversed to that of the subordinate heating coil 32, 34. With such a structure, owing to matching current directions supplied to the main heating coil 30 and the subordinate heating coils 32, 34, the mutual inductance generated between the main heating coil 30 and the subordinate heating coils 32, 34 and the mutual inductance generated between the inverse coupling coils 36, 38 and the subordinate heating coils 32, 34 are reversed in polarity. Accordingly, influences of mutual induction power are mutually cancelled. Accordingly, the influence of the mutual induction generated between the main heating coil 30 and the subordinate heating coil 32, 34 which are arranged adjacently to each other is lessened and individual power controllability can be improved. Here, it is preferable that a winding ratio between the subordinate heating coil 32, 34 and the inverse coupling coil 36, 38 is on the order of 7:1. In this case, it is preferable that the number of winding of the main heating coil 30 is matched with the number of winding of the subordinate heating coil 32, 34.

For example, in the embodiment illustrated in FIG. 2, in a case that the mutual inductance $+M_{12}$ ($+M_{21}$) generated between the inverse coupling coil 36 and the subordinate heating coil 32 and the mutual inductance $-M_{12}$ ($-M_{21}$) generated between the subordinate heating coil 32 and the main heating coil 30 are equal and the mutual inductance $+M_{23}$ ($+M_{32}$) generated between the inverse coupling coil 38 and the subordinate heating coil 34 and the mutual inductance $-M_{23}$ ($-M_{32}$) generated between the subordinate heating coil 34 and the main heating coil 30 are equal, expressions 1 to 3 are satisfied as $I_1$ and $V_1$ denoting current supplied to the subordinate heating coil 32 and voltage of the current, $I_2$ and $V_2$ denoting current supplied to the main heating coil 30 and voltage of the current, and $I_3$ and $V_3$ denoting current supplied to the subordinate heating coil 34 and voltage of the current.

[Expression 1]

$$V_1 = I_1(j\omega L_1) + I_2(j\omega(-M_{21})) + I_2(j\omega(+M_{21})) \quad \text{(Expression 1)}$$

[Expression 2]

$$V_2 = I_2(j\omega L_2) + I_1(j\omega(-M_{12})) + I_1(j\omega(+M_{12})) + I_3(j\omega(-M_{32})) + I_3(j\omega(+M_{32})) \quad \text{(Expression 2)}$$

[Expression 3]

$$V_3 = I_3(j\omega L_3) + I_2(j\omega(-M_{23})) + I_2(j\omega(+M_{23})) \quad \text{(Expression 3)}$$

Here, $L_1$ denotes self-inductance of the subordinate heating coil 32, $L_2$ denotes self-inductance of the main heating coil 30, and $L_3$ denotes self-inductance of the subordinate heating coil 34.

The mutual inductance M can be expressed as follows.

[Expression 4]

$$M = k\sqrt{L_1 \times L_2} \quad \text{(Expression 4)}$$

Here, L1 and L2 denote self-inductance of primary wiring and that of secondary wiring. Self-inductance L can be acquired with expression 5.

[Expression 5]

$$L = N \frac{d\phi}{dI} \quad \text{(Expression 5)}$$

Here, N denotes the number of coil winding, $\phi$ denotes magnetic flux (wb), and I denotes a current value. As described above, the number of coil winding is different between the main heating coil 30 and the inverse coupling coil 36, 38. Therefore, even in a case that magnetic flux ($d\phi$) per unit current (dI) is equal, values of the self-inductance L are to be different. Accordingly, to equal the mutual inductance M generated between the inverse coupling coils 36, 38 and the subordinate heating coils 32, 34 (the polarities are opposite), it is required to adjust a coupling coefficient k. The coupling coefficient k can be varied in accordance with a distance between coils and arrangement formation. Accordingly, the coupling coefficient k for obtaining the mutual inductance +M having a reversed polarity is calculated based on the mutual inductance −M between the main heating coil 30 and the subordinate heating coil 32, 34. To obtain the calculated coupling coefficient k, the inverse coupling coils 36, 38 are arranged as the arrangement formation and inter-coil distances are adjusted.

Owing to that the above relation is satisfied, terms including the mutual inductance due to mutual induction between the main heating coil 30 and the subordinate heating coils 32, 34 are cancelled to each other. Accordingly, it is possible to avoid the influence of mutual induction between the adjacently-arranged induction heating coils.

Each core 40 on which the main heating coil 30 or the subordinate heating coil 32, 34 is arranged to have a center axis paralleled to amount face of the susceptor 52 for the wafer 54 (direction in which the center axis of the core 40 is perpendicular to a center axis of the wafer 54 in a stacked state). A top end face of the core 40 being a magnetic face is faced to the susceptor 52. With the above structure, alternate-current magnetic flux is generated in a direction being parallel to the mount face of the susceptor 52 for the wafer 54 from the magnetic face on which the main heating coil 30 or the subordinate heating coil 32, 34 is wound.

As described above, in a case of viewing the main heating coil 30 as primary winding and the subordinate heating coil 32, 34 as secondary winding, inverters 14a to 14c which will be described later in detail are connected so that directions of current supplied to the both are to be same. Accordingly, the main heating coil 30 and the subordinate heating coils 32, 34 which are stacked in the vertical direction have mutually subtractive polarities.

Figure 3:
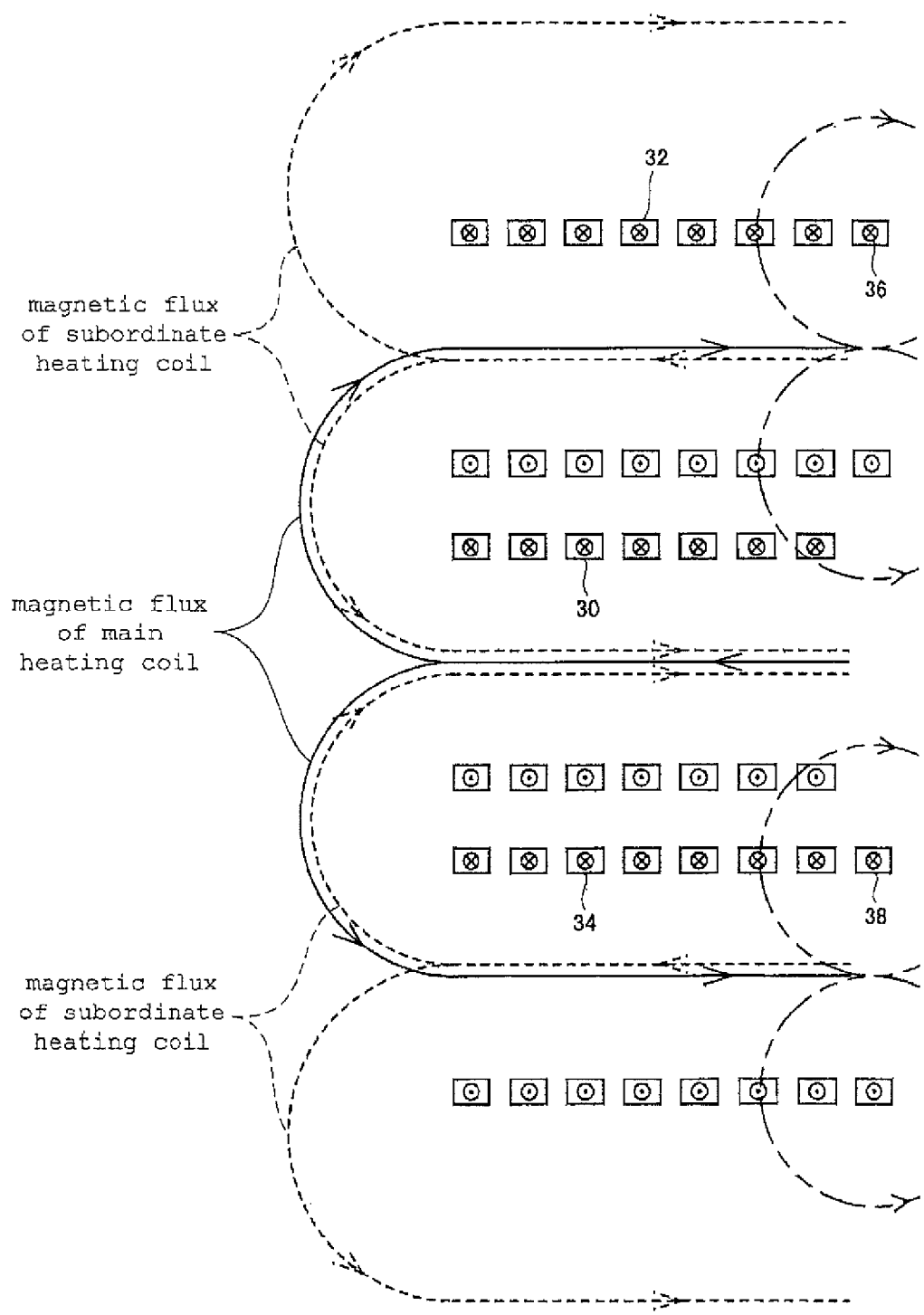
FIG. 3 is a block diagram illustrating a manner of magnetic flux cancellation between stacked induction heating coils.

As illustrated in FIG. 3, with the main heating coil 30 and the subordinate heating coils 32, 34 in arrangement relation as described above, magnetic flux respectively emitted as vertically intersecting the mount face of the susceptor 52 is cancelled as being oriented in mutually opposite directions. Accordingly, even in a case that a metal film or the like is formed on a surface of the wafer 54 to be mounted on the susceptor 52, there is not a fear that the wafer 54 is directly heated owing to influence of the magnetic flux in the vertical direction and that temperature distribution of the wafer 54 is varied.

Here, it is preferable that the main heating coil 30, the subordinate heating coils 32, 34, and the inverse coupling coils 36, 38 are structured with tubular members (e.g., copper pipes) having the inside thereof be hollow. This is because own-heating of the main heating coil 30, the subordinate heating coils 32, 34, and the inverse coupling coils 36, 38 can be suppressed by passing a cooling member (e.g., cooling water) through the inside of the copper pipes during thermal treatment.

As described above, the main heating coil 30 and the subordinate heating coils 32, 34 are adjacently arranged in the vertical direction along the boat 50 on which the susceptors 52 with the wafers 54 mounted are laminated in the vertical direction. With the above structure, it becomes possible to heat more susceptors 52 and wafers 54 at one time, so that thermal treatment of the wafers 54 can be performed effectively. Further, when power control against the induction heating coils which are arranged as being laminated is performed separately, vertical temperature distribution at a plurality of the susceptors 52 which are arranged as being laminated in the boat 50 can be controlled and temperature variation among the susceptors 52 can be suppressed.

The main heating coil 30 and the subordinate heating coils 32, 34 structured as described above are connected to a single power source portion 12. The power source portion 12 is provided with the inverters 14a to 14c, choppers 16a to 16c, a converter 18, a three-phase AC power source 20, and zone control means 22 and is structured to be capable of adjusting current, voltage, frequencies and the like to be supplied to the respective induction heating coils (the main heating coil 30 and the subordinate heating coils 32, 34). In the embodiment illustrated in FIG. 2, a series resonance type is adopted as the inverters 14a to 14c. Accordingly, as a structure to facilitate frequency switching, it is preferable that increase and decrease of capacity are achieved in accordance with a resonance frequency by a switch 28 as resonance capacitors 26 being connected in parallel.

Further, in the thermal treatment apparatus 10 according to the embodiment, a transformer 24 is arranged between each of the induction heating coils (the main heating coil 30 and the subordinate heating coil 32, 34) and each of the inverters 14a to 14c.

The zone control means 22 has a function to perform power control against the main heating coil 30 and the respective subordinate heating coils 32, 34 while avoiding influences of mutual induction generated between the main heating coil 30 and the subordinate heating coil 32, 34 which are adjacently arranged.

Since the main heating coil 30 and the subordinate heating coils 32, 34 which are adjacently arranged as being laminated are operated separately, there may be a case that a harmful influence occurs at separate power control with occurrence of mutual induction between the main heating coil 30 and the subordinate heating coil 32 or between the main heating coil 30 and the subordinate heating coil 34. Accordingly, owing to matching frequencies of current to be supplied to the main heating coil 30 and the subordinate heating coil 32, 34 which are adjacently arranged and controlling to synchronize phases of current waveforms (to set phase difference to zero or to approximate phase difference to zero) or to maintain predetermined phase difference based on detected current frequencies and waveforms (current waveforms) with the zone control means 22, it becomes possible to perform power control (zone control) while avoiding influences of mutual induction between the main heating coil 30 and the subordinate heating coil 32, 34 which are adjacently arranged.

For example, in the abovementioned control, current values, current frequencies, voltage values and the like supplied to the respective induction heating coils (the main heating coil 30 and the subordinate heating coils 32, 34) are detected and input to the zone control means 22. The zone control means 22 detects phases of the current waveform supplied to the main heating coil 30 and the current waveform supplied to the subordinate heating coils 32, 34 and outputs a signal to the inverter 14b or the inverter 14c to instantly vary current frequency to be supplied to the subordinate heating coil 32 or the subordinate heating coil 34 for controlling to perform synchronization of the above or to maintain predetermined phase difference.

Further, regarding the power control, it is simply required to perform power control for obtaining desired vertical temperature distribution as outputting signals for varying into elapsed time from a thermal treatment start to the inverters 14a to 14c or the choppers 16a to 16c based on a control map (vertical temperature distribution control map) which is stored in storage means (memory; not illustrated) arranged at the power source portion 12 or as being based on temperature of susceptors 52 fed back from temperature measuring means (not illustrated). Here, it is simply required that the control map has power values applied to the main heating coil 30 and the subordinate heating coils 32, 34 be recorded along with elapsed time from the thermal treatment start for correcting temperature variation between the susceptors 52 which are arranged as being laminated from the thermal treatment start to a thermal treatment end and for obtaining an arbitrary temperature distribution (e.g., even temperature distribution).

In this manner, at the power source portion 12, owing to that current frequencies supplied to the subordinate heating coils 32, 34 are instantly adjusted based on the signals from the zone control means 22 and phase control of current waveforms is performed while performing power control among the respective induction heating coils, it is possible to control temperature distribution in the vertical direction in the boat 50.

Further, in the thermal treatment apparatus 10 according to the embodiment, owing to arranging the inverse coupling coils 36, 38 which are electromagnetically inversely-coupled with the subordinate heating coils 32, 34, it is possible to previously suppress influences of mutual induction between the main heating coil 30 and the subordinate heating coils 32, 34. Accordingly, the influence of mutual induction to be avoided by the zone control means 22 becomes small and controllability of power control against the main heating coil 30 and the subordinate heating coils 32, 34 can be improved.

Further, according to the thermal treatment apparatus 10 having the abovementioned structure, even in a case that an electrically-conductive member such as a metal film is formed on a surface of the wafer 54, there is not a fear that the metal film produces heat to cause disturbance of temperature distribution of the wafer 54.

Next, a second embodiment of a thermal treatment apparatus of the present invention will be described with reference to FIG. 4. Most of a structure of the thermal treatment apparatus according to the present embodiment is the same as the abovementioned thermal treatment apparatus according to the first embodiment. Here, a numeral being added with one hundred is given in the drawing to a portion having the same structure as the thermal treatment apparatus according to the first embodiment and detailed description thereof will not be repeated.

Figures 1, 4:
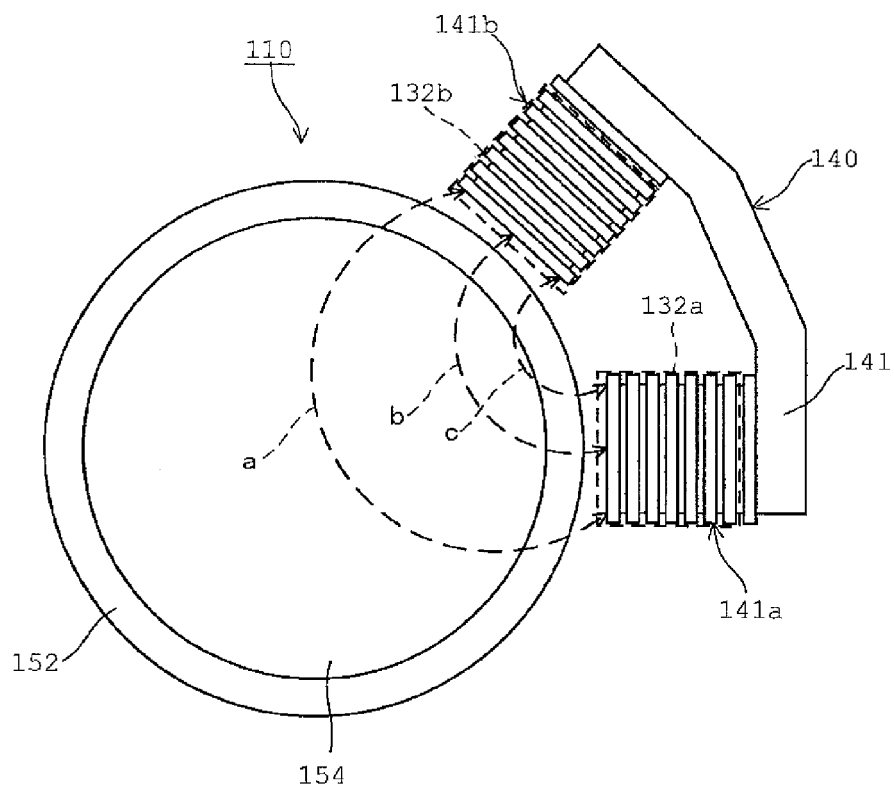
Figures 2, 4:
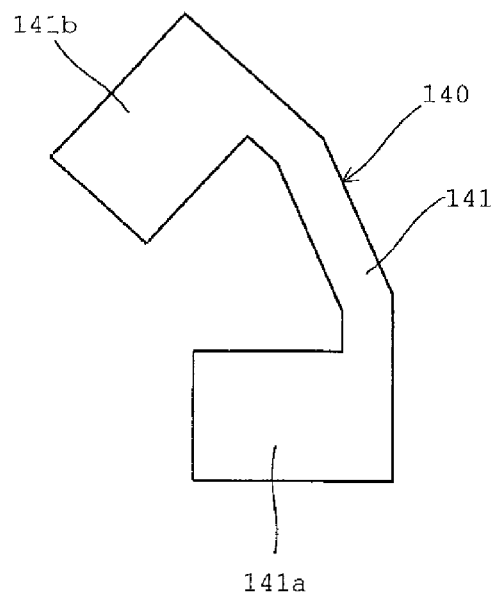
Figure 5:
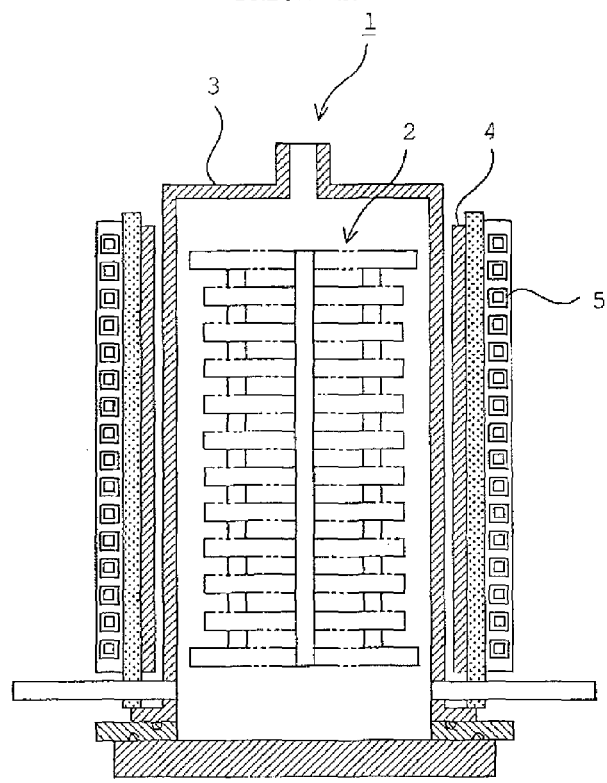
FIG. 5 is a view illustrating a structure of a traditional batch type induction heating apparatus.
Figure 6:
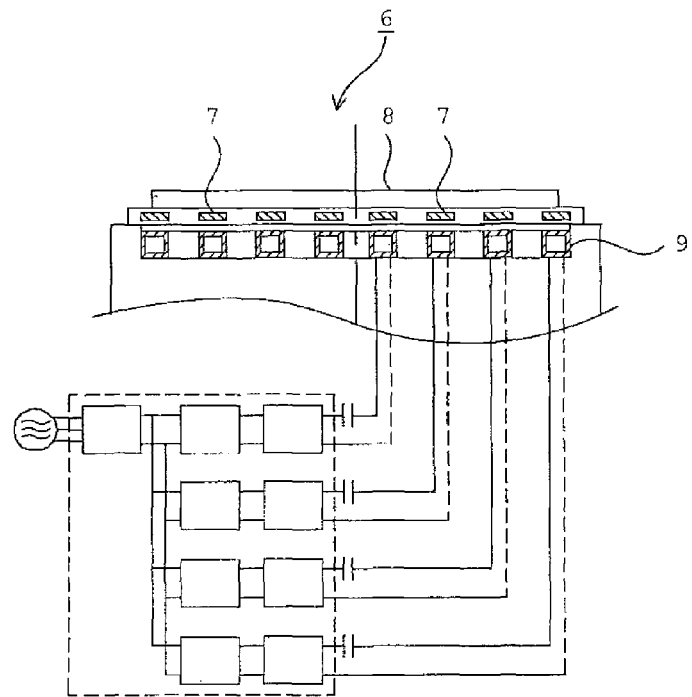
FIG. 6 is a view illustrating a structure of a traditional sheet type induction heating apparatus.

FIG. 4-1 is a block diagram illustrating a plane structure of a thermal treatment apparatus 110 according to the second embodiment and FIG. 4-2 is a block diagram illustrating a plane structure of a core used for the thermal treatment apparatus 110 according to the present embodiment. Although illustration of a power source portion is skipped in the drawing, it is assumed that the power source portion having the similar structure to the abovementioned embodiment is connected.

The thermal treatment apparatus 110 according to the present embodiment has a feature that a plurality of the induction heating coils with each corresponding to the subordinate heating coil 32, the main heating coil 30, and the subordinate heating coil 34 according to the first embodiment. In FIG. 4-1, only subordinate heating coils 132a, 132b are illustrated, and hereinafter, are simply called induction heating coils 132a, 132b for ease of description.

Owing to that the plurality of induction heating coils 132a, 132b are arranged in a direction along the circumferential direction of susceptors 152, a range capable of heating is increased in the horizontal direction and temperature distribution in a surface of a wafer 154 can be stabled.

Further, the thermal treatment apparatus 110 according to the embodiment has a structure that a plurality of (two in the embodiment illustrated in FIG. 4-1) induction heating coils 132a, 132b are wound on a singularly-formed core 140 and that the induction heating coils 132a, 132b are wound respectively on magnetic poles 141a, 141b protruded from a yoke 141. Further, the thermal treatment apparatus 110 according to the present embodiment has a structure that the induction heating coils 132a, 132b arranged in the circumferential direction of the susceptors 152 (horizontal direction) are connected to the power source portion (actually, inverters at the power source portion) in parallel. This is because the abovementioned structure enables to eliminate necessity to consider an influence of mutual inductance between the induction heating coil 132a and the induction heating coil 132b which are arranged in parallel.

Further, winding directions of the respective induction heating coils 132a, 132b on the magnetic poles 141a, 141b of the core 140 are set so that magnetic flux generated by the both respectively has an additive polarity. In a case of the abovementioned structure, magnetic flux is to be generated on loci as illustrated with broken lines a to c. Accordingly, it becomes possible to heat the center side of the susceptors 152 compared to magnetic flux generated by one induction heating coil.

Here, the two induction heating coils 132a, 132b may be selectable between single operation and mutual operation with a change-over switch (not illustrated). In a case of the abovementioned structure, since a heating range of the susceptors 152 is varied in accordance with combination of induction heating coils to be operated, it is possible to perform temperature distribution control in a surface of the wafer 154.

REFERENCE SIGNS LIST

10 Semiconductor substrate thermal treatment apparatus (Thermal treatment apparatus)
12 Power source portion
14a-14c Inverter
16a-16c Chopper
18 Converter
20 Three-phase AC power source
22 Zone control means
24 Transformer
26 Resonance capacitor
28 Switch
30 Main heating coil
32, 34 Subordinate heating coil
36, 38 Inverse coupling coil
40 Core
50 Boat
52 Susceptor
54 Wafer
56 Support member
58 Rotary table

What is claimed is:

1. An induction heating method to perform induction heating on objects to be heated which are arranged on a vertically arranged stack of a plurality of susceptors, comprising:

providing a plurality of induction heating coils and a plurality of inverse coupling coils, each of the plurality of induction heating coils including a main heating coil and a subordinate heating coil electromagnetically coupled to the main heating coil, and each main heating coil being connected to a corresponding one of the plurality of inverse coupling coils, wherein the main heating coil is wound around a main heating coil core, and the subordinate heating coil and the inverse coupling coil are wound around a subordinate heating coil core, the subordinate heating coil being wound around a top end of the subordinate heating coil core and the inverse coupling coil being wound on a rear end of the subordinate heating coil core;

supplying current so that adjacent ones of the plurality of induction heating coils have mutually subtractive polarities, the plurality of induction heating coils which generate horizontal magnetic flux against upper horizontal mount faces of the susceptors for objects to be heated being adjacently stacked along a laminating direction of the susceptors;

separately controlling a power ratio to be supplied to respective ones of the plurality of induction heating coils, wherein the inverse coupling coil provides an additive polarity against the subordinate heating coil, the inverse coupling coil generates mutual inductance having a reverse polarity to mutual inductance generated between the main heating coil and the subordinate heating coil, and the mutual inductance generated between the induction heating coils is at least partially cancelled;

rotating the susceptors in a radial direction relative to a central axis of the susceptors; and positioning the plurality of induction heating coils to be biased toward the central axis of the susceptors.

2. The induction heating method according to claim 1, wherein a top end of the main heating coil core is configured as a susceptor arranged side, the top end of the subordinate heating coil core is configured as a susceptor arranged side, and the adjacent ones of the plurality of induction heating coils are synchronized and with frequencies and directions that are matched with each other and having mutually subtractive polarities, the mount faces of the susceptors for objects to be heated and a center axis of winding being in parallel with winding directions that are the same.

3. The induction heating method according to claim 1, wherein the step of supplying current is performed with phases that are synchronized and with frequencies and directions that are matched to adjacent induction heating coils having mutually subtractive polarities, upper horizontal mount faces of the susceptors for objects to be heated and the center of axis of winding being in parallel and with winding directions that are the same, magnetic flux is emitted therefrom at least horizontally and vertically, and each of the plurality of induction heating coils includes at least one main heating coil and a subordinate heating coil paired therewith that tucks the main heating coil in a laminating direction while being electromagnetically coupled with the main heating coil, an inverse coupling coil connected to the main heating coil in series to generate mutual inductance having a reverse polarity to mutual inductance generated at a space against the subordinate heating coil, a top end of the main heating coil core being configured as a susceptor arranged side, and a top end of the subordinate heating coil core being configured as a susceptor arranged side.

* * * * *